United States Patent [19]
Bogin et al.

[11] Patent Number: 5,953,685
[45] Date of Patent: Sep. 14, 1999

[54] METHOD AND APPARATUS TO CONTROL CORE LOGIC TEMPERATURE

[75] Inventors: Zohar Bogin, Folsom; Vincent E. VonBokern, Rescue, both of Calif.

[73] Assignee: Intel Corporation, Santa Clara, Calif.

[21] Appl. No.: 08/979,835

[22] Filed: Nov. 26, 1997

[51] Int. Cl.[6] .................................................. G05D 23/00
[52] U.S. Cl. ........................ 702/136; 710/36; 702/132; 713/300; 711/100
[58] Field of Search ..................................... 702/130, 132, 702/136; 395/750.01, 287, 821, 835, 838, 849, 843, 842, 856, 728; 257/905, 906, 907, 908; 713/300, 323; 710/36, 48, 49, 15; 711/100, 154

[56] References Cited

U.S. PATENT DOCUMENTS

| | | |
|---|---|---|
| 5,721,837 | 2/1998 | Kikinis et al. ........................... 395/281 |
| 5,732,215 | 3/1998 | Boutaghou et al. ................ 395/200.13 |
| 5,784,328 | 7/1998 | Irrinki et al. ............................. 365/222 |
| 5,798,918 | 8/1998 | Georgiou et al. ....................... 364/148 |
| 5,835,885 | 11/1998 | Lin ............................................ 702/99 |

*Primary Examiner*—John Barlow
*Assistant Examiner*—Patrick Assouad
*Attorney, Agent, or Firm*—Blakely, Sokoloff, Taylor & Zafman

[57] ABSTRACT

A method for controlling core logic temperature. The core logic having a memory controller and memory components coupled to system memory. The method having the step of determining access rate to the system memory through the core logic and controlling the temperature of the core logic by adjusting the access rate.

50 Claims, 7 Drawing Sheets

METHOD AND APPARATUS TO CONTROL CORE LOGIC TEMPERATURE

BACKGROUND OF THE INVENTION

(1) Field of the Invention

The field of the invention is the temperature control of computer components; more specifically, the present invention is related to a method and apparatus for controlling the temperature of core logic components including a memory controller.

(2) Related Art

Each computer system component typically has a corresponding thermal specification which defines the maximum temperature at which a component will likely break down or slow down to cause system failure.

In the prior art approach, device die temperature is measured in terms of voltage variations that reflect temperature changes. The voltage levels are converted to a digital signal that is compared to a pre-determined threshold. When the threshold is exceeded, an interrupt signal is generated to the central processing unit (CPU) which handles the high temperature condition in software.

Many disadvantages are inherent in the prior art approach. For example, the prior art approach is expensive as it requires analog circuitry which requires a high amount of tuning to provide accurate and reliable temperature signals. Further, handling the complexity of analog circuitry requires a long product development period. Finally, the prior art approach utilizes hardware to directly detect the thermal condition but relies on software to actually prevent the thermal violation. The prior approach is therefore exposed to security violations by, for example, virus programs.

It is therefore desirable to have a mechanism which overcomes the above stated disadvantages of the prior art approach and provides a less expensive, easier to calibrate alternative to controlling the temperature of core logic components.

BRIEF SUMMARY OF THE INVENTION

A method for controlling core logic temperature. The core logic has a memory controller coupled to a system memory. The method determines the access rate to the system memory through the core logic and the controls the temperature of the core logic by adjusting the access rate.

DETAILED DESCRIPTION OF THE INVENTION

The present invention provides a method and apparatus for controlling core logic temperature. In one embodiment, core logic as referred herein denotes a memory controller of a computer system.

The present invention monitors and controls memory access rate between a core logic and memory components (e.g., SDRAM) such that power dissipation and therefore thermal specification of the core logic is met. Thermal specification as referred herein designates a particular component's tolerance for heat. For example, given a component, its thermal specification describes the approximate temperature at which the component is likely to slow down and/or cause system failures or to break down.

When the access rate causes excessive temperatures, the present invention's throttling function is enabled. The throttling function slows the access rate for a predetermined period of time that is sufficient to guarantee that the component's thermal specification is not exceeded.

The present invention is simple to validate and has negligible effects on component gate count.

Figure 1:
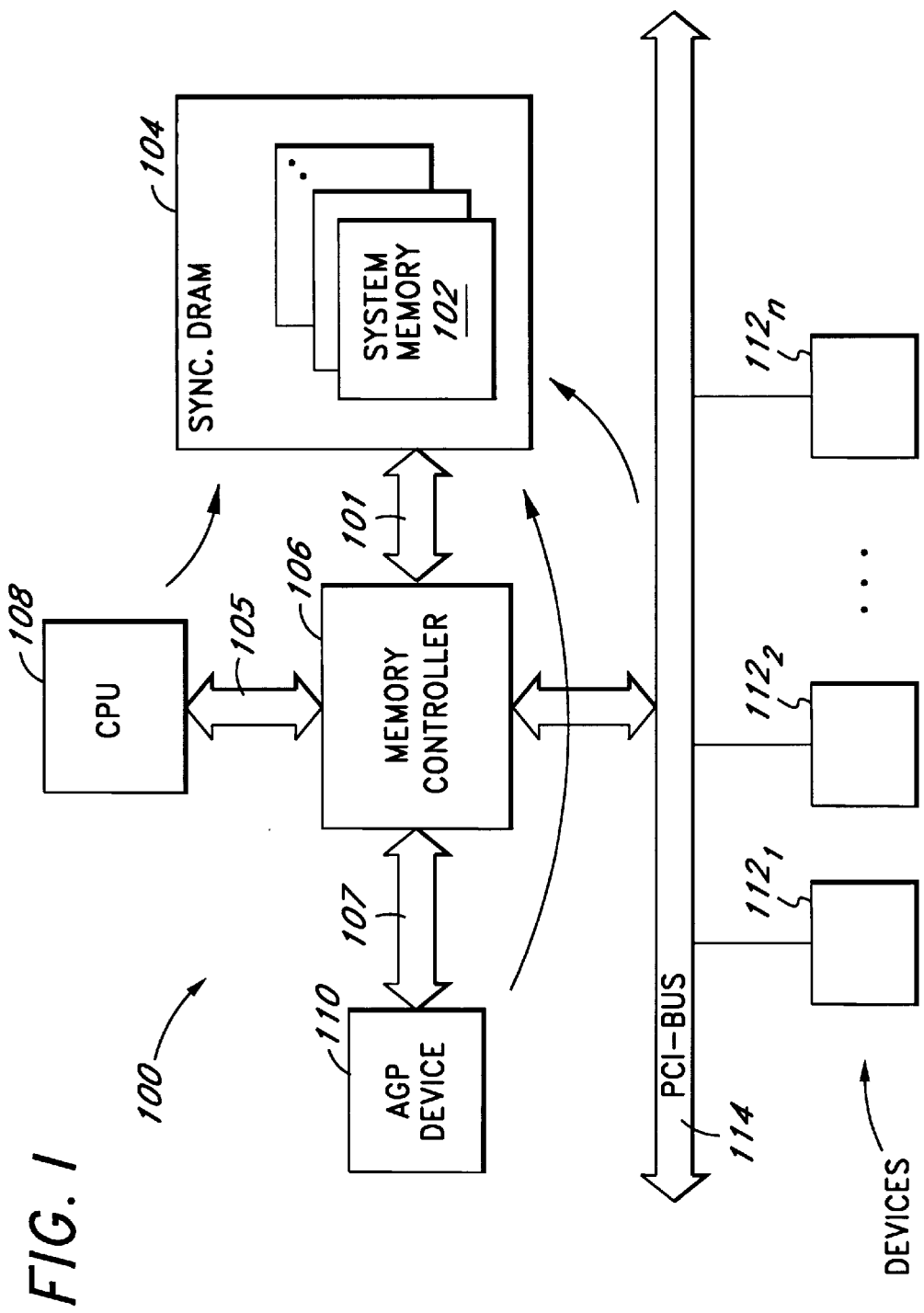
FIG. 1 illustrates an exemplary block diagram of a computer system having a core logic exposed to potential thermal violations.

FIG. 1 illustrates an exemplary block diagram of a portion of a system with core logic components exposed to potential thermal violations. More specifically, in one embodiment, core logic 100 has a memory controller 106 and is coupled to DRAM's 104 including synchronous DRAM's (SDRAM) and a system memory 102 by bus 101. The memory controller 106 couples the system memory 102 and the SDRAM's 104 to various devices including a central processing unit (CPU) 108 such as an Intel Pentium® II processor coupled by a bus 105, an advanced graphics port (AGP) device 110 coupled by a bus 107, and a plurality of peripheral component interconnect (PCI) devices $112_1$ through $112_N$ coupled by bus 114. Although not shown, a person skilled in the art may appreciate that the system may also include various other components typically found in a computer system.

The PCI devices $112_1$ through $112_N$ are Input/Output (I/O) hardware devices that are coupled to the system through a PCI expansion connector (not shown) or mounted to the personal computer (PC) motherboard (not shown). Examples of PCI or other I/O devices include, but are not limited to a graphic controller/card, a disk controller/card, a local area network (LAN) controller/card and a video controller/card. The AGP device 110 is coupled to the system memory 102 through the memory controller 106 and is designed to attempt to optimize the graphics data transfer operations in high speed personal computers (PC).

Memory controller 106 provides the CPU 108, the AGP device 110 and the PCI devices $112_1$ through $112_N$ access to the system memory 102. For example, on a data write transaction, a write request as well as the data to be written into system memory are passed to and processed by the memory controller 106. On a read transaction, a read request is passed to the memory controller 106 and the data requested is sent back from the system memory 102 to the requesting components such as the CPU 108, the AGP device 110 and/or the PCI devices $112_1$ through $112_N$.

Because of the high traffic and the high volume of data in read and write requests being processed and driven to the system memory 102 by the memory controller 106, the memory controller 106's power consumption increases causing a direct increase in the temperature of the memory controller 106. If the temperature crosses over a certain thermal threshold as defined by the memory controller 106's temperature specification, the memory controller 106 may break down, slow down and/or cause system failure. Similarly, the thermal specification of the SDRAM's 104 may be violated due to increased temperature on processing a high volume of read requests. The present invention's digital method and apparatus controls the core logic 100 temperature by monitoring data access rate through the memory controller to ensure that such breakdown is prevented.

Although the core logic 100 is illustrated as having a memory controller 106, in another embodiment the core logic 100 may also include a host bridge connecting the system memory to various components such as, for example, the CPU, peripheral interconnect (PCI) devices and the advanced graphics port (AGP) device. In yet another embodiment, the core logic 100 has one or more bus (e.g., PCI bus) controllers, a graphics (e.g., AGP) controller and a CPU controller in addition to the memory controller to control data access between various components such as, for example, bus and graphics devices, the system memory and the CPU.

Figure 2A:
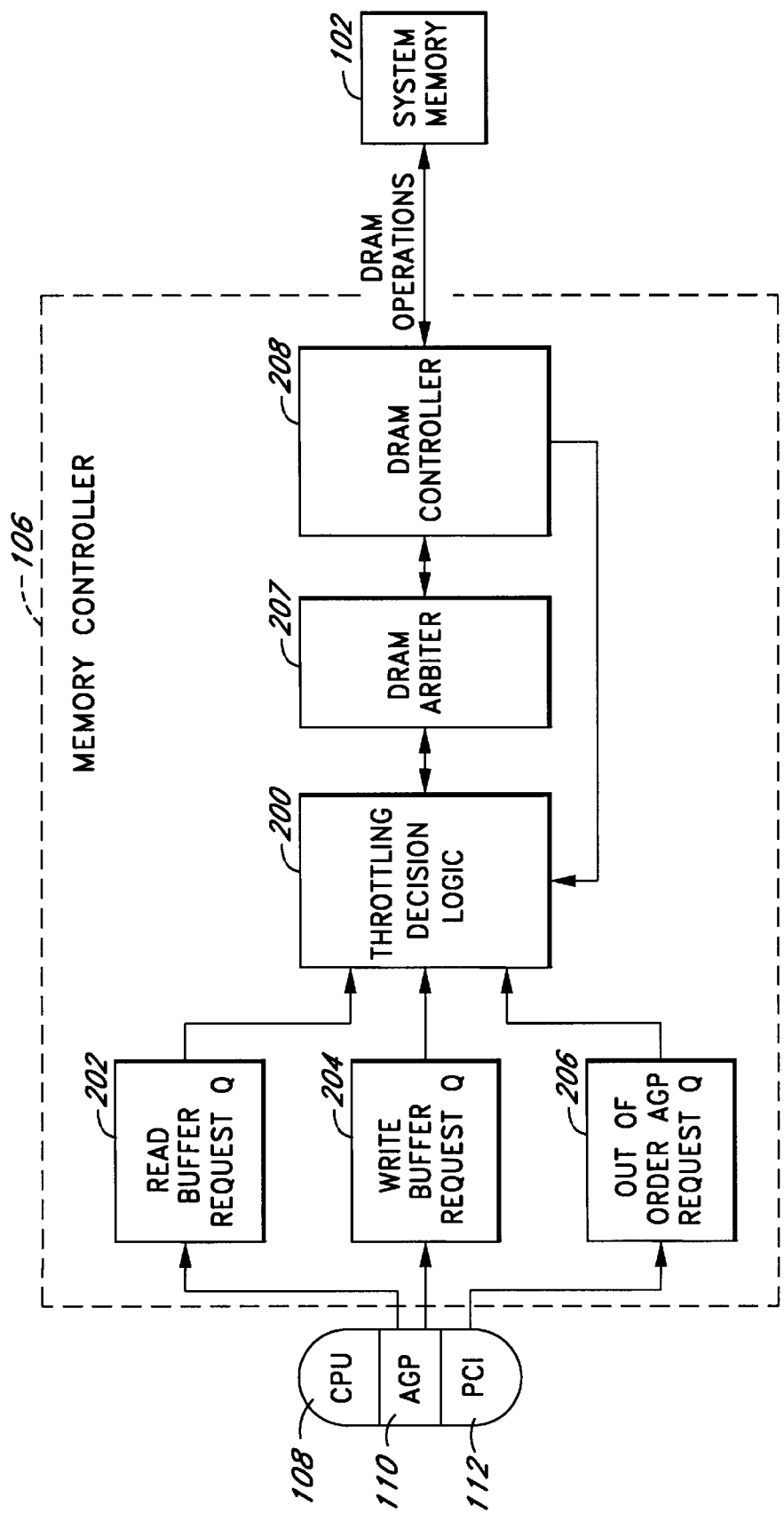
FIG. 2A is a block diagram illustrating one embodiment of a portion of the internal components comprising the memory controller illustrated in FIG. 1.

FIG. 2A is a functional block diagram of one embodiment of a memory controller. A throttling decision logic 200 is coupled to multiple data read and write request/data queues 202, 204 and 206. The throttling decision logic 200 monitors the access rate of data transfer requests to system memory and generates signals limiting the number of data transfer requests processed when the access rate is greater than or equal to a predetermined threshold.

A read request queue 202 contains a plurality of read requests made by various system components. A write buffer request queue 204 contains a plurality of write requests made by various components of the core logic 100. An out of order AGP request queue 206 contains AGP requests made by the AGP device 110.

The throttling decision logic 200 is coupled to a DRAM arbiter 207 which passes on the read/write requests to a DRAM controller 208. The DRAM controller 208 performs DRAM operations, e.g. read and write requests, to the system memory. The DRAM arbiter 207 receives control signals from the throttling decision logic 200 which specifies the timing and the duration that the DRAM arbiter 207 is to hold up the processing of read requests to prevent thermal violations in the SDRAM and to hold up the processing of both read and write requests to prevent thermal violations in the memory controller.

Figure 2B:
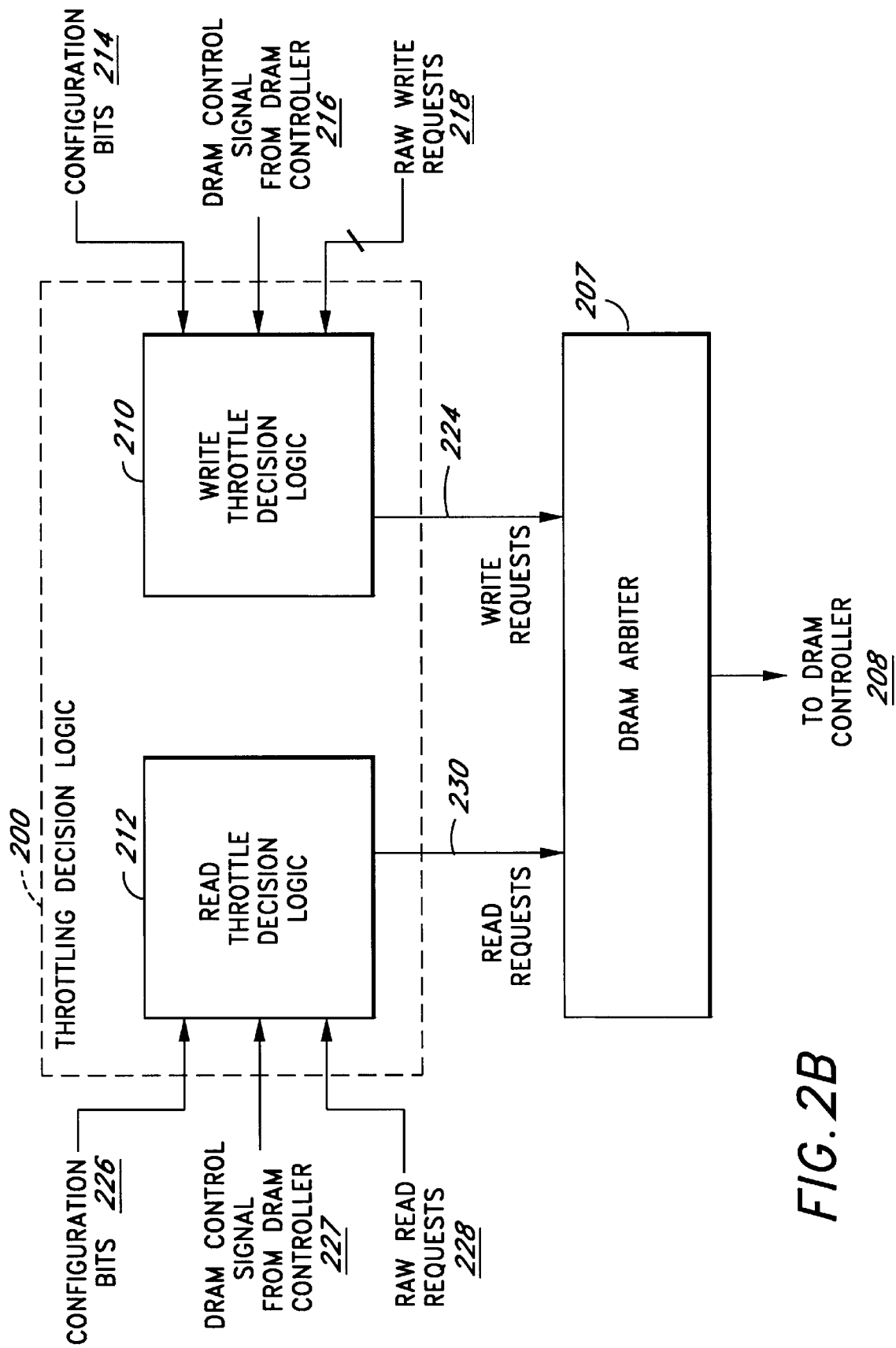
FIG. 2B is a block diagram of one embodiment of a throttling decision logic coupled to a DRAM arbiter of the memory controller.

FIG. 2B is a block diagram of one embodiment of the throttling decision logic coupled to the DRAM arbiter in more detail. Throttling decision logic 200 has a write throttle decision logic 210 and a read throttle decision logic 212.

One or more configuration bits are used by the write throttle decision logic 210 to monitor write requests to the system memory and generate signals to the DRAM arbiter to limit the write requests to be processed when the write access rate has reached a predetermined threshold. Configuration bits 214 are predefined values used to determine whether the write throttle should be enabled. Various registers which are the source of the configuration bits are illustrated in the block diagram of FIG. 3B.

A DRAM control signal 216 from the DRAM controller provides the write throttle decision logic 210 with the number of quad words (QW) written to the system memory. Write requests 218 from the CPU, the AGP device and/or the PCI devices are provided to the write throttle decision logic 210 to be masked and passed on to the DRAM arbiter 207 by the write request line 224 if write throttling is to be enabled. Otherwise, write requests 218 are passed on to the DRAM arbiter 207 without change through the write request line 224.

A DRAM control signal 227 from the DRAM controller provides the number of QW reads made to the system memory to the read throttle decision logic 212. Read requests 228 from the CPU, the AGP device and/or the PCI devices are provided to the read throttle decision logic 212 to be masked if the read throttle is to be enabled. Otherwise, the read requests 218 are forwarded to the DRAM arbiter 207 unchanged through the read request line 230.

Figure 3A:
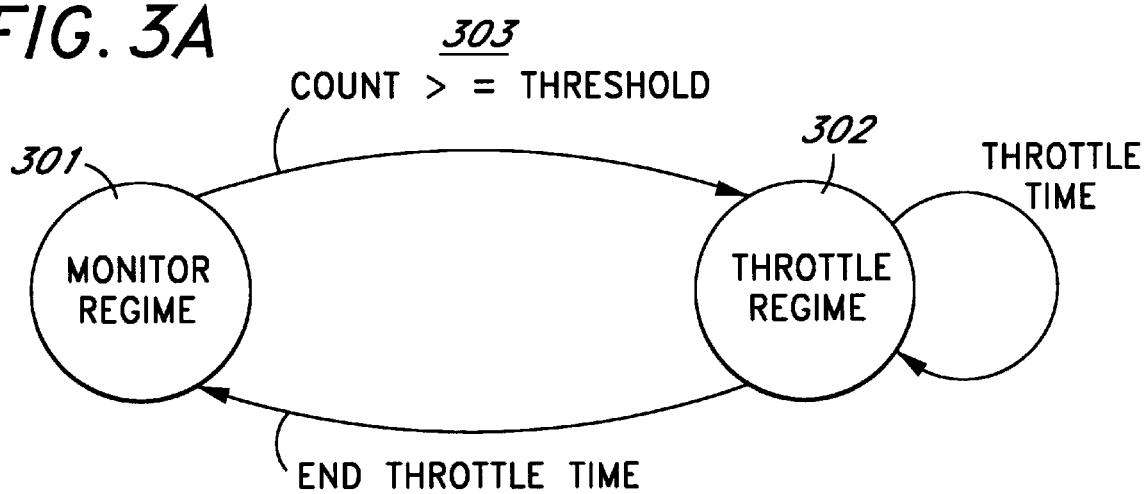
FIG. 3A illustrates the two states of one embodiment of the throttling decision logic.

FIG. 3A illustrates the two regimes of one embodiment of the throttling decision logic. One regime is a monitor regime 301 and the other is a throttle regime 302.

In the monitor regime 301, the throttling decision logic monitors the usage of data access rate to and from the system memory through the memory controller 106. If the access rate crosses certain thresholds, the throttling decision logic enters a throttle regime 302 for a specified period. Otherwise, the throttling decision logic remains in the monitor regime 301.

While in the monitor regime 301, a sampling window is defined during which the access rate to the system memory is monitored. During the sampling window, the accesses to the system memory are counted. At the end of the sampling window, the total number of accesses counted is compared to a defined threshold. For example, given a maximum bandwidth of 800 megabytes per second (MB/s) at which the thermal specification of a memory component is violated, threshold may then be defined as some lower bandwidth such as 500 MB/s. If the counted accesses exceeds the threshold (state transition 303), the function enters the throttle regime 302. Otherwise, a new sampling is used to restart the monitor regime 301.

In the throttle regime 302, the throttling decision logic actively limits the access rate to a defined limit that guarantees that the thermal specification is not violated for the memory controller (i.e. the rated maximum temperature is not exceeded). More specifically, in the throttle regime 302, the throttling decision logic determines that the data access rate must be throttled and sends the DRAM arbiter a mask write or a mask read request to limit the access rate for a defined period of time.

The throttle regime 302 specifies the throttling time. The throttling time may be an integer multiple of a given sampling window. In one embodiment, each throttling time is in the order of seconds and is further divided into throttling windows which are in the order of microseconds (for example ten microseconds). For each throttling window, there is a maximum quad-word (QW) value provided which designates the number of accesses that may be performed. More access requests to system memory are blocked by the DRAM arbiter for the remaining duration of the throttling window. The ratio of access budget to throttling windows effectively controls the access rate to guarantee that the die temperature of the core logic components remains controlled.

Figure 3C:
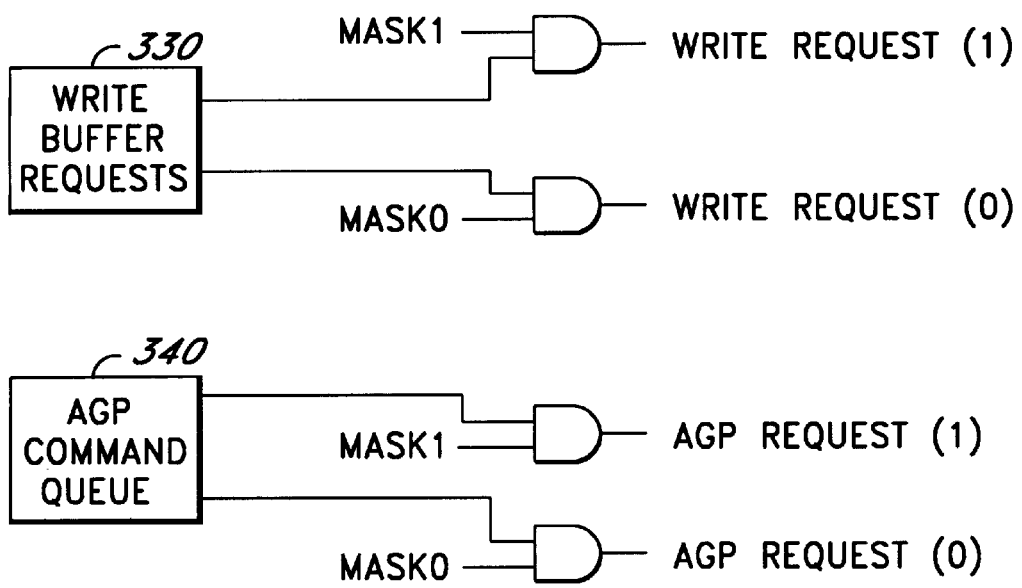
FIG. 3C illustrates the masking of read and write requests.
Figure 3B:
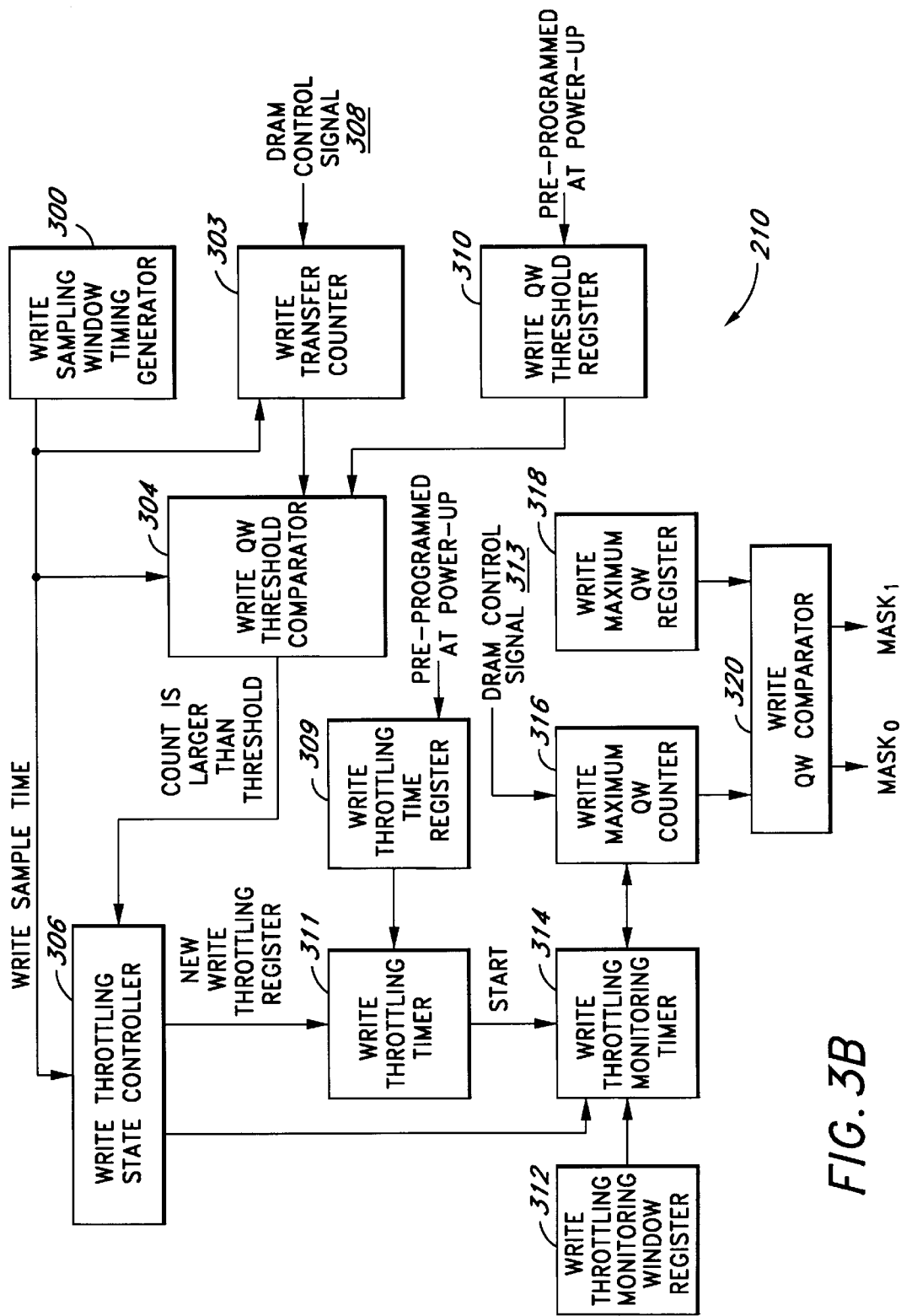
FIG. 3B is a block diagram of one embodiment of the throttling decision logic.

FIG. 3B illustrates one embodiment of the throttling decision logic of the memory controller which generates signals input to the DRAM arbiter to limit the number of data requests to be supported and to limit the duration of the support to prevent thermal violation of the core logic components. Although the block diagram illustrated in FIG. 3B is illustrated for write data requests only, a person skilled in the art may appreciate from the detailed description provided herein that read data requests may also be processed in substantially the same manner as illustrated in the block diagram.

The throttling decision logic remains in the monitor regime until the throttling function is enabled. While in the monitor regime, the write sampling time stored in the write sampling window timing generator and register 300 is fed into a write transfer counter 303, a write quad word (QW) threshold comparator 304 and a write throttling state controller 306.

The write sampling window timing generator and register 300 has a predetermined duration such as one second pre-programmed into the register 300. The duration may be hardwired. The predetermined duration is a time period within which a sampling window samples the number of data requests being made to the system memory through the memory controller 106. More generally, the throttling decision logic monitors the amount of read/write traffic that is generated to the system memory.

The write transfer counter 303 monitors DRAM control signal 308 which indicates the number of data units being transferred to the system memory. In one embodiment, these data units are quad-words (QW). A write QW threshold register 310 is pre-programmed at power up of the computer system by the computer system's boot program (not shown) with a QW threshold of the memory controller. Thus, each time a computer is started or "booted up" using a boot program, a predetermined QW threshold is copied into the write QW threshold register 310 by the boot program. Pre-programming registers using a boot program is well known in the art.

The write QW threshold is selected based on the computer system's bandwidth threshold which guarantees that the memory controller temperature is kept under the specified value. For example, if the sampling window is 1 second and the maximum sustained bandwidth is 500 megabytes (MB) per second, then the desired threshold is 500 divided by 8 which is 62.5 maximum QW per second.

The size of the sampling window is made based on the temperature gradient resulting from the change of bandwidth from some steady state to a maximum bandwidth. For example, if the temperature gradient is 10° C./second, the steady state temperature is 105° C. and the maximum specified temperature is 115° C., then the sampling window is set to 1 second.

At the end of the write sampling window, the write QW threshold comparator 304 compares the number of write data transfers being made as counted by the write transfer counter 303 against the thermal threshold data rate as stored in the write QW threshold register 310. If the number of write data transfer that was counted by the write transfer counter 303 within a write sampling time (as is designated by write sampling window timing generator and register 300) is greater than or equal to the QW threshold data rate given by the write QW threshold register 310, then the write QW threshold comparator 304 signals the write throttling state controller 306 to begin a new write throttle regime. Otherwise, the write throttling logic monitors new write transfers in a monitor regime.

The write throttling state controller 306 then initiates a new write throttle regime and notifies the write throttling timer 311 to access a write throttling time period stored in a write throttling time register 309. The write throttling time period is pre-programmed at power up of the computer system. Further, in one embodiment, the write throttling time is selected in a manner that optimizes the relationship between the throttling factor and the throttling duration.

In general, the longer the throttling time, the lower throttling has to be used. It is desirable for the throttling ratio to be as low as possible to reduce or even minimize its effect on system operation and performance. Further, it is desirable to have the smallest possible throttling time to allow the system to return to the monitor regime and re-assess the need for throttling. Thus, there is a point at which the effect on system operation is minimal but yet the throttling time is small enough to provide sufficient granularity for monitoring the traffic to the system memory.

For example, let K be the ratio between the sampling window and throttling time and let T.BW be the allowed bandwidth during a throttle regime. Further, assume that the required sustained bandwidth is 500 megabytes per second (MB/S), and assume a maximum bandwidth of 800 MB/S when a throttling threshold is exceeded. With the given quantities, the following equation is maintained:

$$500 \text{ MB/S} = \frac{T \cdot BW \times K + 800 \text{ MB/S}}{K + 1}$$

or:

$$T \cdot BW = \frac{500(K+1) - 800}{K}$$

where $K = 1$      $T \cdot BW = 200$ MB/S
$K = 2$      $T \cdot BW = 350$ MB/S
$K = 3$      $T \cdot BW = 400$ MB/S
.
.
.
$K = 63$(maximum)      $T \cdot BW \approx 500$ MB/S To achieve a given average bandwidth that guarantees the desired component temperature, throttling may be performed deeper for a short time or less deeply for a longer time. As was illustrated above, assuming that the maximum bandwidth is 800 MB/second and the desired sustained bandwidth is 500 MB/second. If the sampling period is set to 1 second, the desired sustained bandwidth may be achieved by throttling for a period of 1 second down to 200 MB/second or throttle for 2 seconds (K=2) at 350 MB/second (T.BW=350 MB/S).

Once the write throttling state controller 306 initiates a new write throttling regime, a write throttling monitoring timer 314 is signaled by the write throttling state controller 306 and the write throttling timer 311 to begin a new write throttling monitoring time. The write throttling monitoring timer 314 begins counting the time period designated by a write throttling monitoring window register 312.

Thus, both the write throttling timer 311 and the write throttling monitoring timer 314 begin counting a predetermined time period. Hence, in one embodiment, for each one unit of write throttling timer 314, there are multiple write throttling monitoring windows. For example, for every one second of a write throttling monitoring time, there may be multiple write throttling monitoring windows with a duration of ten microseconds each.

The present invention's throttling is based on limiting the amount of data transfers allowed to be performed during a given time period. If a budget of transfers is allocated to a throttling time of typically one or more seconds, the transfers may have to be masked for a time duration of portions of a second or more. Long delays (or latency) in executing cycles cause certain system operation failures. For example, operating systems are sensitive to such long delays as it attempts to measure time in sub-second units. In one embodiment, the operating system typically measures time eighteen times in a second, or once every 55 microseconds. The present invention allocates smaller budgets to a smaller time unit in such an order (for example, in the order of 5 micro-seconds) that basic system operation will not be impacted.

A write maximum QW counter 316 receives the DRAM control signal 313 that designates the number of write data transfers occurring during each write throttling monitoring window. A write maximum QW register 318 contains a maximum unit of write data transfer (quad word) which is compared to the accumulated write data transfer as counted by the write maximum counter 316. If the accumulated maximum QW as counted by the write maximum QW counter 316 is greater than or equal to the write maximum QW stored in the write maximum QW register 318, then a write maximum QW comparator 320 outputs a write mask control to the DRAM arbiter.

In one embodiment, for each and every write throttle monitoring window, a budget of a write maximum QW is allocated to be performed. If more write requests are introduced within the same write throttling monitoring window, the write requests are blocked by the DRAM arbiter and will not be executed until the end of the current write throttling monitoring window.

The write maximum QW is selected in accordance with the throttle monitoring window and based on the bandwidth desired while throttling. For example, if the throttle window is selected to be 10 micro-seconds and the desired throttle bandwidth is 350 MB/second, then the selected write maximum QW is approximately 437 quad words (QW).

As mentioned earlier, the read data transfers are processed in the same manner as the write data transfers. More specifically, a read sampling window is a time period during which a read transfer counter monitors the amount of read traffic that is generated to the system memory. The read sampling window is associated with the monitor regime. At the end of the read sampling window, the accumulated number of QW reads from the system memory is compared to a predetermined read QW threshold.

If the accumulated number of QW is greater than the read QW threshold, then there is a need to throttle the read requests and the throttle regime is entered. Otherwise, the present invention will again monitor read requests.

Once there is a need to throttle read requests, the DRAM controller enters the throttle regime. The DRAM controller will remain in the throttle regime for a duration of a predetermined read throttling time stored in a read throttling time register. In one embodiment, the throttle regime is further divided into a plurality of read throttle monitoring windows. For example, if a read throttling time is a few seconds, the read throttle monitoring window may be set to ten microseconds.

Finally, for each and every read throttling monitoring window, the present invention allocates a budget of read maximum QW to be performed. If more read requests are introduced in the same read throttling monitoring window, the requests are blocked by the DRAM arbiter and will not be executed until the end of the current read throttle monitoring window.

FIG. 3C illustrates the masking of read and write requests performed in the throttling decision logic prior to the masked requests being input to the DRAM arbiter. Write buffer requests 330 is fed into two AND gates along with a mask one (1) for masking pending write buffer requests and mask zero (0) for masking current write buffer requests. An input of one is made for the respective masks when throttling is disabled and an input of zero is made for the respective masks when throttling is enabled. The respective write requests are then passed on to the DRAM arbiter. Similarly, given an AGP command queue 340, the inputs are provided to AND gates which also accept a mask one (1) for pending AGP command queue requests and mask zero (0) for current AGP command queue requests. The respective AGP requests are then forwarded to the DRAM arbiter. Other masking schemes may be employed and would be apparent to those skilled in the art.

Figure 4A:
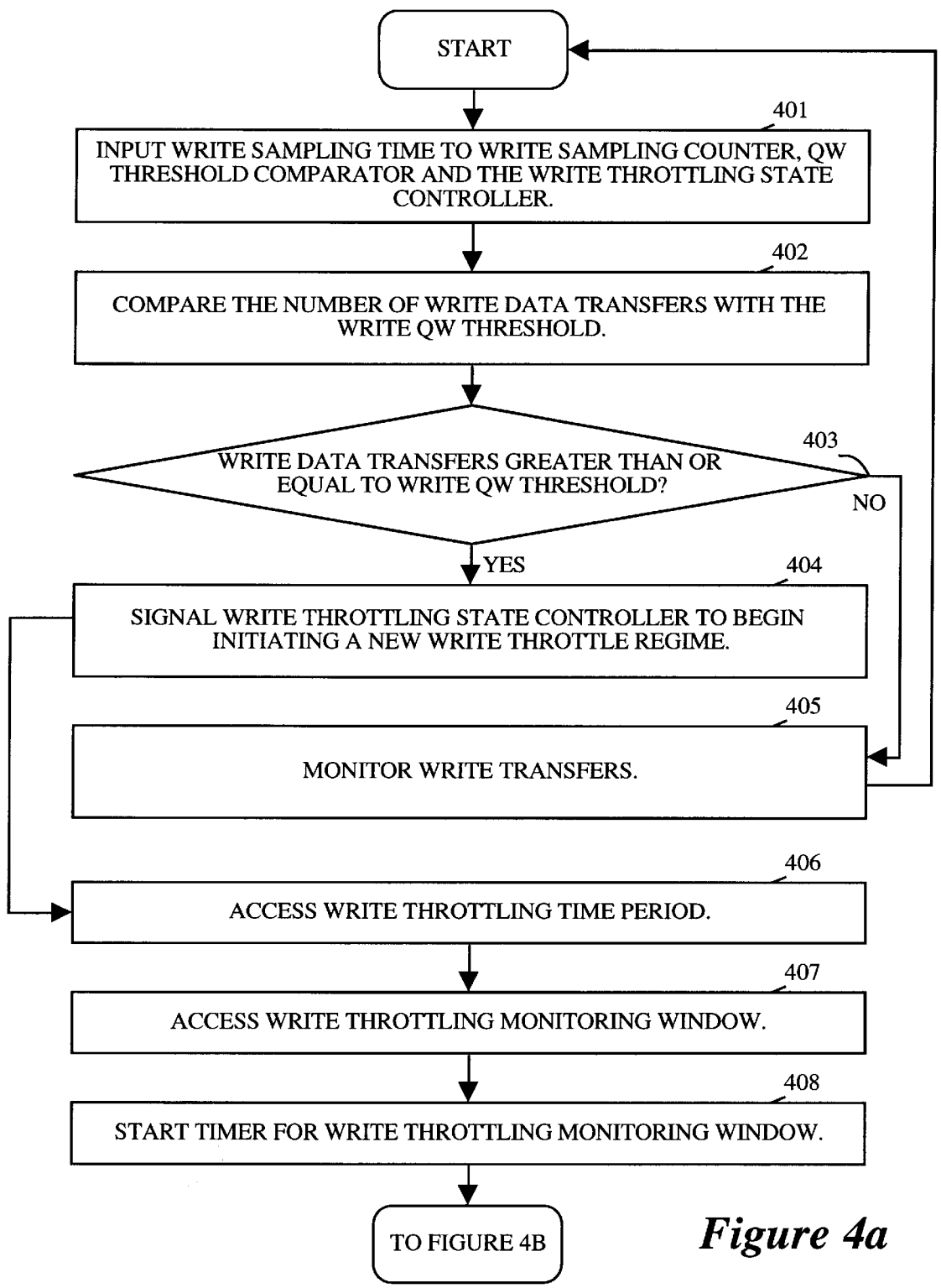
FIGS. 4A and 4B are flow diagrams illustrating the general steps followed by one embodiment of the present invention for controlling core logic temperature.
Figure 4B:
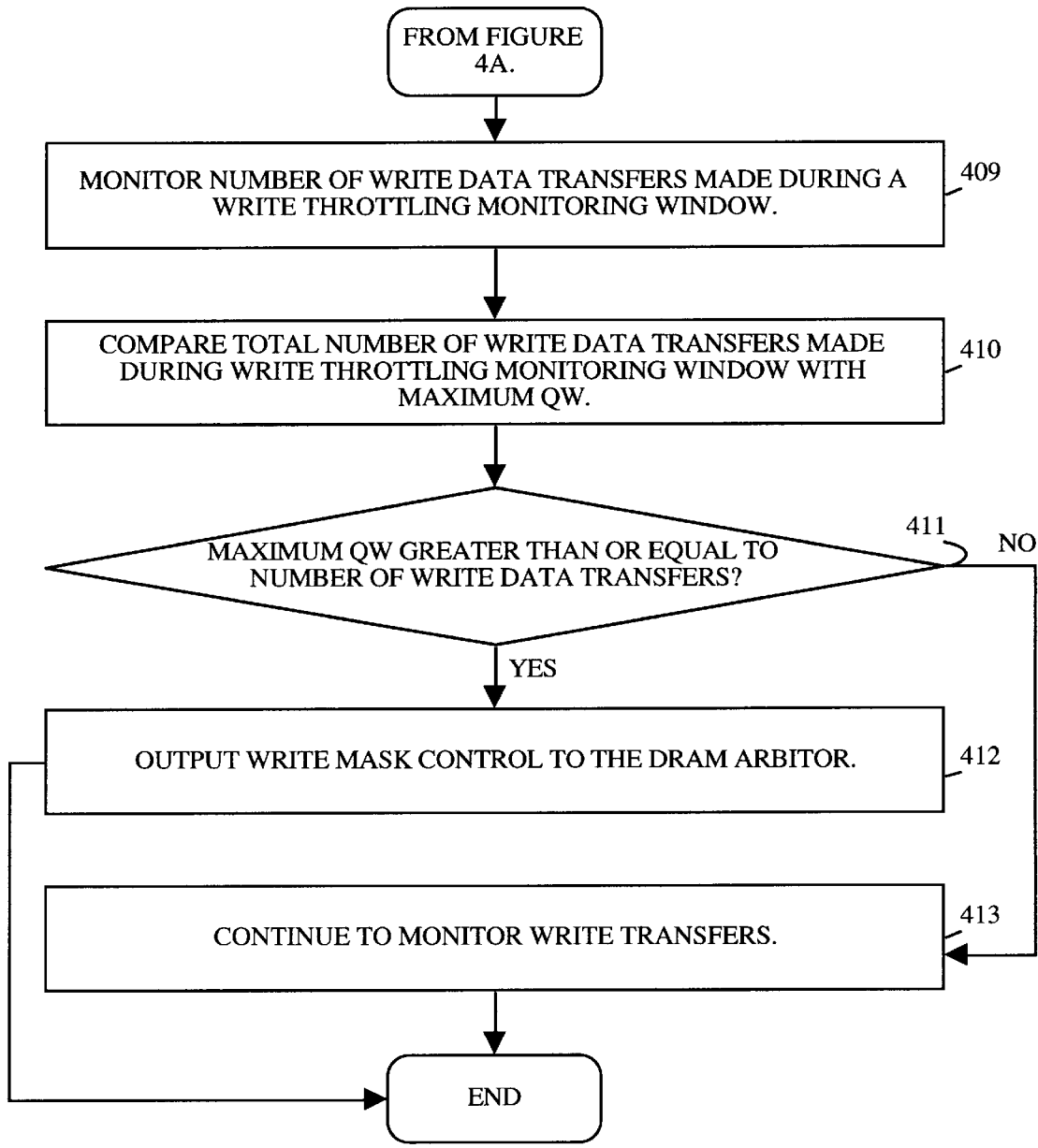

FIGS. 4A and 4B are flow diagrams illustrating the general steps followed by one embodiment of the present invention. The flow diagrams illustrated in FIGS. 4A and 4B are illustrated for write data requests; however, read data requests may also be processed in the same manner as illustrated in the flow diagrams.

In step 401, the write sampling time stored in the write sampling window timing generator and register 300 is fed into a write transfer counter 303, a write quad word (QW) threshold comparator 304 and a write throttling state controller 306. The write transfer counter 303 counts the number of write requests being supported by the memory controller during the write sampling window.

In step 402, at the end of the write sampling window, the write QW threshold comparator 304 compares the number of write data transfers that are counted by the write transfer counter 303 against the thermal threshold data rate as stored in a write QW threshold register 310. In step 403, if the number of write data transfer that is counted by the write transfer counter 303 during the write sampling window is greater than or equal to the QW threshold given by the write QW threshold register 310, then in step 404, the write QW threshold comparator 304 signals the write throttling state controller 306 to initiate a new write throttle regime. Otherwise, in step 405, the write throttling decision logic will again monitor write transfers.

In step 406, the write throttling state controller 306 enters a new write throttle regime and notifies the write throttling timer 311 to access a write throttling time period stored in a write throttling time register 309. In step 407, the write throttling monitoring timer 314 is signaled by the write throttling state controller 306 and the write throttling timer 311 to access a write throttling monitoring time from a write throttling monitoring window register 312. In step 408, the write throttling monitoring timer 314 begins counting the time period designated by the write throttling monitoring window register 312.

In step 409, the write maximum QW counter 316 receives the DRAM control signal 313 that designates the number of write data transfers occurring during each write throttling monitoring widow. In step 410 the maximum unit of data write transfer in a write maximum QW register 318 is compared to the accumulated write data transfer as counted by a write maximum QW counter 316. In step 411, if the accumulated maximum QW as counted by the write maximum QW counter 316 is greater than or equal to the write maximum QW stored in the write maximum QW register 318, then in step 412 a write maximum QW comparator 320 outputs a write mask control to mask the write requests to the DRAM arbiter. Otherwise, in step 413 the throttling decision logic will again monitor the write transfers.

What has been described is a method and apparatus to control core logic temperature to prevent thermal violations of the core logic. The write access rate provides control of the memory controller thermal conditions while the read access rate provides control of the DRAM components. Thus, the present invention provides independent monitor and control of read and write access rates. For example, when write throttling conditions are met as determined by the write throttling decision logic, the present invention blocks writes but attempts to service read requests for as long as the read throttling function is not enabled.

While certain exemplary embodiments have been described in detail and shown in the accompanying drawings, it is to be understood that such embodiments are merely illustrative of and not restrictive on the broad invention, and that this invention is not to be limited to the specific arrangements and constructions shown and described, since various other modifications may occur to those with ordinary skill in the art.

What is claimed:

1. A method for controlling core logic temperature, said core logic having a memory controller coupled to system memory, said method comprising:

determining access rate to the system memory through the core logic within a predetermined sampling window;

determining whether said access rate within the predetermined sampling window exceeds a predetermined data threshold, said predetermined data threshold indicative of an amount of data that can be transferred before a potential thermal violation occurs; and controlling temperature of the core logic by adjusting said access rate.

2. The method of claim 1 wherein determining the access rate comprises counting a number of data transfer requests made to the system memory within the predetermined sampling window.

3. The method of claim 2 wherein determining whether said access rate within the predetermined sampling window exceeds the predetermined data threshold comprises comparing said number of data transfer requests with said predetermined data threshold.

4. The method of claim 2 further comprising initiating throttling of data transfer requests if said number of data transfer requests is greater than or equal to said predetermined data threshold.

5. The method of claim 4 further comprising pre-programming a throttle time period during which the number of data transfer requests is monitored while throttling.

6. The method of claim 5 further comprising pre-programming a throttling monitoring window which is a sub-unit of said throttle time period.

7. The method of claim 6 further comprising monitoring the number of data transfers during said throttling monitoring window.

8. The method of claim 7 further comprising pre-programming a value which designates the maximum number of data transfers allowed to be processed before a potential thermal violation occurs.

9. The method of claim 8 further comprising comparing said number of data transfers made during said throttling monitoring window with said value.

10. The method of claim 9 further comprising generating a mask control signal to mask subsequent data transfer requests within said throttling monitoring window when said number of data transfers exceeds said value during said throttling monitoring window.

11. The method of claim 8 wherein said value is a maximum data value.

12. A memory controller comprising:

a throttling decision logic configured to generate a mask control signal to mask data transfer requests to system memory prior to the temperature of the memory controller rising above a predetermined thermal specification;

one or more queues coupled to said throttling decision logic, a first queue configured to hold one or more data transfer requests by a graphics device; and a controller coupled to said throttling decision logic, said controller configured to generate control signals to said throttling logic designating processed data transfer requests.

13. The memory controller of claim 12 further comprising a plurality of queues coupled to said throttling decision logic, said plurality of queues configured to hold data transfer requests generated by a plurality of respective devices.

14. The memory controller of claim 12 further comprising a second queue configured to hold one or more data transfer requests by a central processing unit.

15. The memory controller of claim 12 further comprising a second queue configured to hold one or more data transfer requests by a peripheral component interconnect-compatible device.

16. A memory controller, comprising:

a logic block including a read decision logic to generate a mask control signal to mask read data transfer requests to system memory prior to the temperature of the memory controller rising above a predetermined thermal specification; and a controller coupled to said logic block, said controller to generate control signals to said logic block designating processed data transfer requests.

17. The memory controller of claim 16 wherein said logic block further comprises a write decision logic to generate a second mask control signal to mask write data transfer requests to system memory prior to the temperature of the memory controller rising above the predetermined thermal specification.

18. A memory controller, comprising:

a controller to transmit a control signal designating processed data transfer requests; and a throttling decision logic coupled to receive the control signal from the controller, the throttling decision logic to generate a mask control signal to mask data transfer requests to system memory prior to the temperature of the memory controller rising above a predetermined thermal specification, the throttling decision logic including a sampling window timing generator to generate a sampling window which designates a time duration during which a number of data transfer requests processed is counted by monitoring said control signals.

19. The memory controller of claim 18 wherein the throttling decision logic further comprising a counter coupled to said sampling window timing generator, said counter configured to monitor said control signal to determine the number of data transfer requests processed during said sampling window.

20. The memory controller of claim 19 wherein the throttling decision logic further comprising a comparator coupled to said sampling window timing generator and said transfer counter, said comparator to compare said number of data requests processed during said sampling window to a predetermined threshold.

21. The memory controller of claim 20 wherein the throttling decision logic further comprising a threshold register coupled to said comparator, said threshold register configured to hold said predetermined threshold.

22. The memory controller of claim 21 wherein the throttling decision logic further comprising a throttling state controller coupled to said sampling window timing generator and said comparator, said throttling state controller to initiate a throttle regime if said comparator determines that said number of data requests processed during said sampling window is greater than or equal to said predetermined threshold.

23. The memory controller of claim 22 wherein the throttling decision logic further comprising a throttling timer coupled to said throttling state controller, said throttling timer to count a throttling time period during which a predetermined maximum number of data transfer requests are allowed to be processed through the memory controller.

24. The memory controller of claim 23 wherein the throttling decision logic further comprising a throttling time register coupled to said throttling timer, said throttling time register to hold a value designating said maximum number of data transfer requests allowed to be processed through the memory controller during said throttling time period.

25. The memory controller of claim 24 wherein the throttling decision logic further comprising a throttling monitoring timer coupled to said throttling timer, said throttling monitoring timer to count a throttling monitoring window time period which is a sub-unit of said throttling time period.

26. The memory controller of claim 25 wherein the throttling decision logic further comprising a throttling monitoring window register coupled to said throttling monitoring timer, said throttling monitoring window register to hold said throttling monitoring window time period.

27. The memory controller of claim 26 wherein the throttling decision logic further comprising a maximum counter coupled to said throttling monitoring timer, said maximum counter to receive said control signal designating said data transfer requests processed and count the number of said data transfer requests processed during each said throttling monitoring window of said throttling time.

28. The memory controller of claim 27 wherein the throttling decision logic further comprising a second comparator coupled to said maximum quad word counter, said comparator to compare said number of data transfer requests processed during each said throttling monitoring window of said throttling time to a maximum value, said second comparator generating a mask control signal if said number of data transfer requests processed is greater than or equal to said maximum value.

29. The memory controller of claim 28 wherein the throttling decision logic further comprising a maximum register coupled to said second comparator, said maximum register to hold said maximum value.

30. A system comprising:
a random-access memory (RAM) to accept data transfer requests from one or more devices; and
a memory controller coupled to said RAM, said memory controller to control temperature of the system based on the number of said data transfer requests made, said memory controller including a throttling decision logic to generate a mask control signal to mask data transfer requests to said RAM prior to said temperature of the system crossing over a predetermined thermal specification.

31. The system of claim 30 wherein said RAM is a synchronous dynamic RAM.

32. The system of claim 30 further comprising a control device coupled to said throttling decision logic, said control device to generate one or more control signals to said throttling decision logic designating processed data transfer requests.

33. The system of claim 32 further comprising one or more queues coupled to said throttling decision logic, said one or more queues to each hold one or more data transfer requests generated by said one or more respective devices.

34. The system of claim 33 wherein one of said devices comprises a central processing unit.

35. The system of claim 33 wherein one of said devices comprises an advanced graphics port.

36. The system of claim 33 wherein one of said devices comprises a peripheral component interconnect compatible device.

37. The system of claim 33 wherein said throttling decision logic further comprises a read throttle decision logic to generate a mask control signal to mask read data transfer requests to the RAM prior to the temperature of said memory controller rising above said predetermined thermal specification.

38. The system of claim 37 wherein said throttling decision logic further comprises a write throttle decision logic to generate a mask control signal to mask write data transfer requests to the RAM prior to the temperature of the memory controller rising above said predetermined thermal specification.

39. The system of claim 38 further comprising a sampling window timing generator to generate a sampling window which designates a time duration during which the number of data transfer requests processed is counted by monitoring said one or more control signals.

40. The system of claim 39 further comprising a transfer counter coupled to said sampling window timing generator, said transfer counter configured to monitor one of said control signals to determine the number of data transfer requests processed during said sampling window.

41. The system of claim 40 further comprising a quad word threshold comparator coupled to said sampling window timing generator and said transfer counter, said quad word threshold comparator to compare said number of data requests processed during said sampling window to a quad word threshold.

42. The system of claim 41 further comprising a quad word threshold register coupled to said quad word threshold comparator, said quad word threshold register to hold said quad word threshold.

43. The system of claim 42 further comprising a throttling state controller coupled to said sampling window timing generator and said quad word threshold comparator, said throttling state controller to initiate a throttle regime if said quad word threshold comparator determines that said number of data requests processed during said sampling window is greater than or equal to said quad word threshold.

44. The system of claim 43 further comprising a throttling timer coupled to said throttling state controller, said throttling timer to count a throttling time period during which a predetermined maximum number of data transfer requests in quad words are allowed to be processed through said memory controller.

45. The system of claim 44 further comprising a throttling time register coupled to said throttling timer, said throttling time register to hold a value designating said maximum number of data transfer requests in quad words allowed to be processed through said memory controller during said throttling time period.

46. The system of claim 45 further comprising a throttling monitoring timer coupled to said throttling timer, said throttling monitoring timer to count a throttling monitoring window time period which is a sub-unit of said throttling time period.

47. The system of claim 46 further comprising a throttling monitoring window register coupled to said throttling monitoring timer, said throttling monitoring window to hold said throttling monitoring window time period.

48. The system of claim 47 further comprising a maximum quad word counter coupled to said throttling monitoring timer, said maximum quad word counter to receive one of said control signals designating said data transfer requests processed and count the number of said data transfer requests processed during each said throttling monitoring window of said throttling time.

49. The system of claim 48 further comprising a quad word comparator coupled to said maximum quad word counter, said quad word comparator to compare said number of data transfer requests processed during each said throttling monitoring window of said throttling time to a maximum quad word value, said quad word comparator generating a mask control signal if said number of data transfer requests processed is greater than or equal to said maximum quad word value.

50. The system of claim 49 further comprising a maximum quad word register coupled to said quad word comparator, said maximum quad word register to hold said maximum quad word value.

* * * * *